(12) United States Patent
Taga

(10) Patent No.: US 6,543,109 B1
(45) Date of Patent: Apr. 8, 2003

(54) METHOD OF MANUFACTURING A SURFACE ACOUSTIC WAVE APPARATUS

(75) Inventor: Shigeto Taga, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/506,459

(22) Filed: Feb. 17, 2000

(30) Foreign Application Priority Data

Mar. 2, 1999 (JP) .............................. 11-054192

(51) Int. Cl.⁷ .............................................. H01L 41/22
(52) U.S. Cl. ..................... 29/25.35; 29/832; 29/843; 29/593; 29/594; 310/313 R; 310/344
(58) Field of Search ............... 29/25.35, 843, 29/840, 594, 593, 832; 310/364, 313 R, 334, 344, 354, 348; 174/52.1, 260; 228/180.21, 110.1; 333/193

(56) References Cited

U.S. PATENT DOCUMENTS

| | | | | |
|---|---|---|---|---|
| 5,058,800 A | * | 10/1991 | Yoshizawa et al. | 228/180.2 |
| 5,459,368 A | * | 10/1995 | Onishi et al. | 310/313 |
| 5,699,027 A | * | 12/1997 | Tsuji et al. | 333/193 |
| 5,712,523 A | | 1/1998 | Nakashima et al. | 310/313 R |
| 5,821,665 A | * | 10/1998 | Onishi et al. | 310/313 |
| 5,991,989 A | * | 11/1999 | Onishi et al. | 29/25.35 |
| 6,131,257 A | * | 10/2000 | Nishihara et al. | |
| 6,246,013 B1 | * | 6/2001 | Yoshida et al. | |
| 6,321,444 B1 | * | 11/2001 | Yatsuda et al. | 29/832 |
| 6,329,739 B1 | * | 12/2001 | Sawano | 310/313 R |
| 6,369,490 B1 | * | 4/2002 | Taga | 310/364 |

| | | | | |
|---|---|---|---|---|
| 2002/0003459 A1 | * | 1/2002 | Yatsuda et al. | 29/25.35 |

FOREIGN PATENT DOCUMENTS

| | | | |
|---|---|---|---|
| EP | 0722218 | * | 7/1996 |
| EP | 0 961 404 | | 12/1999 |
| JP | 59-92552 | * | 5/1984 |
| JP | 62-181517 | * | 8/1987 |
| JP | 4-196324 | * | 7/1992 |
| JP | 7-154185 | | 6/1995 |
| JP | 8-307197 | * | 11/1996 |
| JP | 09-232899 | | 9/1997 |
| JP | 10-32460 | | 2/1998 |
| JP | 10-98352 | | 4/1998 |
| JP | 10-256409 | | 9/1998 |
| JP | 10-256415 | | 9/1998 |
| JP | 10-313227 | | 11/1998 |
| JP | 11-204681 | * | 7/1999 |

OTHER PUBLICATIONS

Abstract of Japan 10–256415, Sep. 1998.
Abstract of Japan 10–256409, Sep. 1998.

* cited by examiner

Primary Examiner—Carl J. Arbes
Assistant Examiner—Minh Trinh
(74) Attorney, Agent, or Firm—Keating & Bennett, LLP

(57) ABSTRACT

A method of manufacturing a surface acoustic wave apparatus includes the steps of bump-bonding a surface acoustic wave element and a base member together through metal bumps having a melting point of about 450° C. or higher such that the surface acoustic wave apparatus is fixed in a face down configuration to a bottom surface of a recess of the base member; and bonding a cap member and the base member with a wax material by heating the cap member and the base member uniformly at a temperature higher than a melting point of the wax material to melt the wax material.

21 Claims, 2 Drawing Sheets

METHOD OF MANUFACTURING A SURFACE ACOUSTIC WAVE APPARATUS

BACKGROUND OF THE INVENTION

1. Field of the Invention

The present invention relates to a method of manufacturing a surface acoustic wave apparatus in which a surface acoustic wave element is sealed in a package.

2. Description of the Related Art

Conventionally, a surface acoustic wave apparatus is formed by connecting and fixing a surface acoustic wave element onto a base member through bump bonding, then by sealing the surface acoustic wave element in a package defined by bonding a cap member onto the base member. In the past, with such a surface acoustic wave apparatus, a seam welding method has been used and a Kovar alloy is used to define a joint so as to form an air-tight fixation between the base member and the cap member.

Further, sealing methods other than the seam welding method include a wax sealing method which requires that a wax material is applied to connecting portions of either the base member or the cap member, a small heater block is then contacted with for example the cap member, thereby heating the cap member so as to melt the wax material, followed by a cooling treatment to join the base member with the cap member.

When the above seam welding method is used to join the base member to the cap member, during a seam welding process, the connecting portion of either the cap member or the base member is only partially heated so as to be elevated to a high temperature, resulting in the base member and the cap member being joined together under a condition involving a significant temperature difference between the connecting portions and other portions. Then, with the cooling of the surface acoustic wave apparatus, a large residual stress is generated between the base member and the cap member, hence causing the base member 10 and the cap member 30 to deform significantly, as shown in FIG. 3. Subsequently, because of such a deformation, stress is concentrated on metal bumps 51 which have been used to connect and fix the surface acoustic wave element 20 on to the base member 10, and is also concentrated on electrodes 12 and 25 combined with metal bumps 51. Accordingly, there had been a problem that the metal bumps 51 and the electrodes 12, 25 would be damaged and are caused to peel off, resulting in some defective connections and defective characteristics.

When the wax sealing method is used to join the base member with the cap member, there also arises a problem that the base member would be deformed after the above joining treatment due the same reason mentioned above, causing problems similar to problems occurring in the seam welding method.

Note that it is necessary to provide a space for allowing for free vibration of the electrodes on the surface (surface acoustic wave propagating surface) of the surface acoustic wave element. However, since it is impossible to fill a space between the surface acoustic wave element and the base member with a resin using a process similar to forming a semiconductor device, it is impossible to reduce or eliminate the stress concentrated on the metal bumps, hence making it impossible to improve the joint strength. Accordingly, in order to improve the reliability of a surface acoustic wave apparatus, it is extremely important to reduce the stress exerted on the metal bumps.

SUMMARY OF THE INVENTION

In order to overcome the problems described above, preferred embodiments of the present invention provide a method of manufacturing a surface acoustic wave apparatus which reduces and minimizes a stress exerted on the metal bumps during a process of jointing the base member and the cap member, and prevents problems occurring in connecting portions of the metal bumps, thereby ensuring a sufficient reliability.

A preferred embodiment of the method of manufacturing a surface acoustic wave apparatus includes the steps of bump-bonding a surface acoustic wave element and a base member together through metal bumps having a melting point of about 450° C. or higher such that the surface acoustic wave apparatus is fixed in a face down configuration to a bottom surface of a recess of the base member; and bonding a cap member and the base member with a wax material by heating the cap member and the base member uniformly at a temperature higher than a melting point of the wax material to melt the wax material.

With the use of the above manufacturing method, since there is no temperature difference between the different members during the process of joining together the base member and the cap member, a residual stress exerted on the surface acoustic wave apparatus after cooling treatment is minimized, thus greatly reducing the stress on the metal bump connecting portions. For this reason, it is possible to reliably and greatly reduce damage to the metal bumps and damage to the electrodes connected on the bump connecting portions, and to greatly reduce connection problems such as the peeling-off of the metal bumps or bump connecting portions. However, the surface acoustic wave element may be bump bonded or joined in advance by way of metal bumps having a melting point of about 450° C. or higher, so as to be strongly supported and fixed on the base member while at the same time being electrically connected.

As the wax material, it is preferable to use a solder, an Au—Sn alloy, or a low melting point glass which has a softening point of not more than about 450° C.

As described in the above, according to preferred embodiments of the present invention, the surface acoustic wave element is strongly connected and fixed on the base member via metal bumps having a melting point of about 450° C. or higher and the surface acoustic wave apparatus as a whole is uniformly heated so as to join the base member with the cap member, thereby greatly reducing a stress exerted on the metal bump connecting portions. Therefore, it is possible to prevent the connection problems occurring in the metal bumps and the bump connecting portions, thereby obtaining a surface acoustic wave apparatus having a high reliability.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
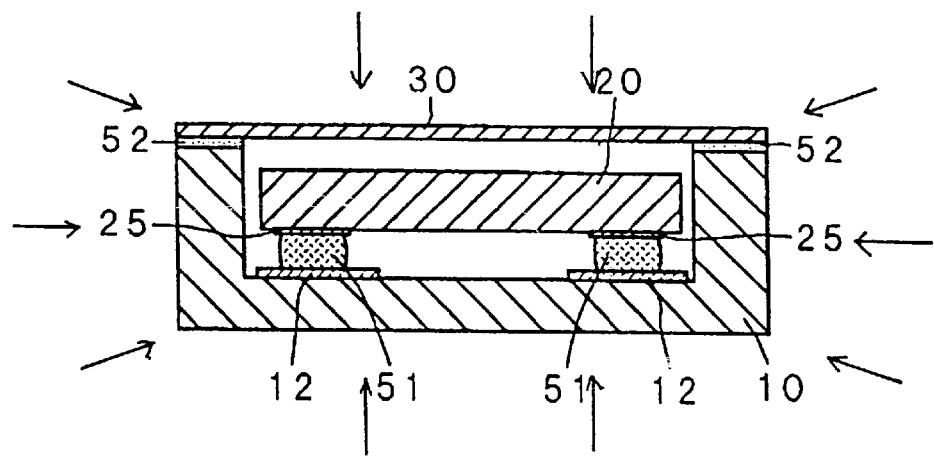
FIG. 1 is a cross sectional view of a surface acoustic wave apparatus made according to a preferred embodiment of the present invention.
Figure 2:
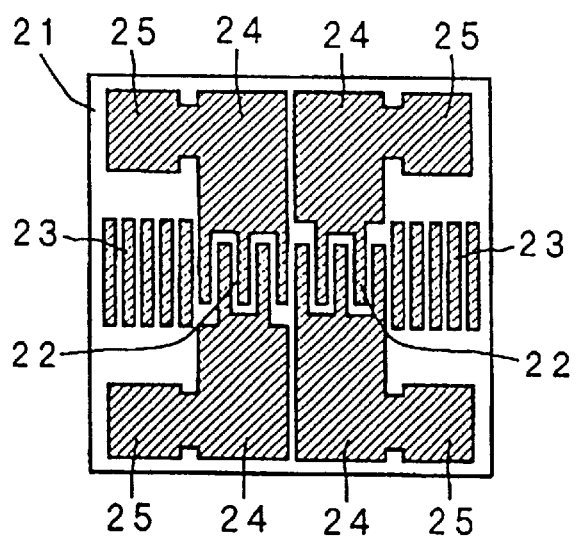
FIG. 2 is a plane view indicating a surface acoustic wave element made according to a preferred embodiment.
Figure 3:
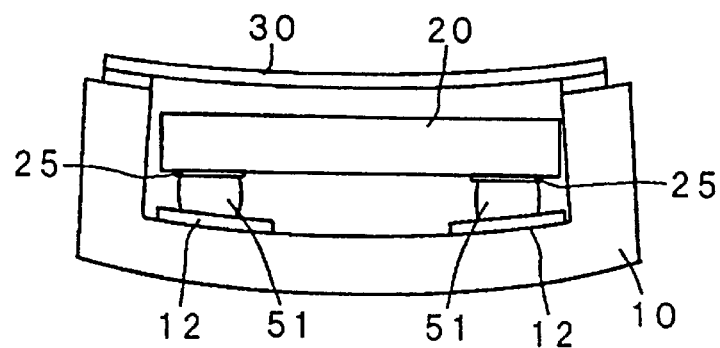
FIG. 3 is a brief cross sectional view for explaining a deformation occurring during a process when the base member and the cap member are joined together to form a conventional surface acoustic wave apparatus.

FIG. 1 is a cross sectional view illustrating a surface acoustic wave apparatus manufactured according to a preferred embodiment of the present invention, and FIG. 2 is a plane view illustrating a surface acoustic wave element shown in FIG. 1.

In the surface acoustic wave apparatus, a plurality of electrode pads 25 of the surface acoustic wave element 20 and a plurality of electrode lands 12 formed on the surface of a recess portion of a base member 10 are bump bonded through metal bumps 51 with a face-down configuration. The surface acoustic wave element 20 is fixed and supported on the base member 10 and is electrically connected thereon. Further, a cap member 30 is joined with the base member 10 via a wax material 52 having a high melting point wax such that the surface acoustic wave element 20 is covered up. Thus, the surface acoustic wave element 20 may be airtightly sealed in the package (within the space) defined by the base member 10 and the cap member 30. In this surface acoustic wave apparatus, between the surface acoustic wave propagating surface of the surface acoustic wave element 20 and the base member 10, a gap (a space) is provided for more efficiently propagating the surface acoustic wave, as shown in FIG. 1.

The surface acoustic wave element 20 includes, as shown in FIG. 2, a piezoelectric substrate 21. On the upper surface of the piezoelectric substrate 21, an electrode pattern including IDT (interdigital transducer) electrodes 22, reflector electrodes 23, outlet electrodes 24 extending from all of the IDT electrodes 22, and electrode pads 25 connected with all of the outlet electrodes 24. The electrode pattern is preferably made of Al or it may be made of an alloy containing Al, and is preferably formed by using a known film formation method. As the piezoelectric substrate 21, it is possible to use a piezoelectric material such as lithium tantalate or lithium niobate or other suitable material.

The base member 10 preferably has a concave configuration and is formed preferably by laminating a plurality of ceramic layers, and has an input/output electrode pattern and an earth electrode pattern including a plurality of electrode lands 12 extending on its underside surface, the inner surface of its recess portion and inside itself. Although not shown in the drawings, input and output terminal electrodes are provided on the underside surface of the base member 10. Using the underside surface of the base member 10 as a mounting surface, the surface acoustic wave apparatus may be mounted on a mounting board (a circuit board).

The cap member 30 is preferably a metal plate made of a Fe—Ni alloy or an alloy containing Fe, or other suitable material, and may be subjected to a plating treatment if necessary.

The surface acoustic wave apparatus is preferably manufactured in the following way. At first, a ball-bonding method is preferably used to form a metal bump 51 on each electrode pad 25 of the surface acoustic wave element 20, with the each metal bump 51 preferably made of Au or a material containing Au as its main component. Then, the surface acoustic wave element 20 is arranged face down such that its surface acoustic wave propagating surface including IDTs and other electrodes is caused to face toward the base member 10, followed by the simultaneous application of a supersonic wave and heat. In this way, each electrode pad 25 and its corresponding electrode 1 and 12 of the base member 10 are joined together through a metal bump 51, thereby connecting and the fixing the surface acoustic wave element 20 on the base member 10.

It is not necessary to form each metal bump 51 of Au, and it is possible to form the metal bump 51 of other metal materials, provided that such metal materials do not easily become molten or softened during a subsequent process for joining together the base member 10 and the cap member 30 and that such materials preferably have a melting point of about 450° C. or higher.

Although the above description has explained a method in which a supersonic wave and heat may be simultaneously applied during the above bump joining process, it is also possible to use a method in which only a supersonic wave or heat is applied during the above bump joining process. Further, a method of forming the metal bumps is not necessarily limited by the ball-bonding method. It is also possible to use other methods for forming the metal bumps, such as a bump formation method involving a plating treatment.

Next, the cap member 30 on which a wax for forming the wax material 52 and having a high melting point is mounted so as to press on the cap member, is laid over the base member 10. Then, the cap member 30 and the base member 10 are introduced into a reflow furnace so that the base member 10, the surface acoustic wave element 20 and the cap member 30 are all uniformly heated to a temperature higher than the melting point of the wax material 52 as indicated by arrows in FIG. 1, thereby melting the wax material 52 and thus causing the base member 10 and the cap member 30 to be joined together. At the time, the temperature for heat is preferably not more than about 450° C. so that the bump does not melt.

In this way, with the use of the method for manufacturing the surface acoustic wave apparatus according to the present preferred embodiment, since the base member and the cap member are joined together in a process where the surface acoustic wave apparatus as a whole is uniformly heated, there will be no temperature difference between the different members during the joining treatment. Therefore, a residual stress exerted on the surface acoustic wave apparatus after cooling treatment is minimized to be extremely small, thus greatly reducing the stress on the metal bump connecting portions. For this reason, it is possible to reliably and greatly reduce damages of the metal bumps and damages of the electrodes connected on the bump connecting portions, and to greatly reduce connection problems such as the peeling-off of these members, thereby making it possible to improve the yield, reduce the rate of failure, and achieve great improvements in its reliability.

As a wax material, apart from the above-described wax, it is also possible to use an Au—Sn alloy or a low melting point glass. Further, although it has been described in the above preferred embodiment that the wax material was mounted on the cap member pressing the same, it is also possible that the wax material may be formed in advance on the base member, or alternatively it may be formed through printing treatment.

Further, although it has been described in the above preferred embodiment that a reflow furnace may be used to join together the base member and the cap member, the present invention is not so limited. It is also possible to use a heating furnace or an oven capable of uniformly heating the entire surface acoustic wave apparatus.

Moreover, a material forming the cap member should not be limited to the Fe—Ni alloy or an alloy containing Fe. It is also possible to use other material capable of achieving an excellent airtight sealing property when used with the wax material. Further, a material for forming the cap member should not be limited to a metal. It is also possible to use a ceramic material to form the cap member. In such a case, it is possible to use a low melting point glass as a wax material. In addition, it is possible to use a base member formed of a metal.

Further, the shapes of the base member and the cap member should not be limited to that in the above described preferred embodiment. It is also possible, for example, to make a package defined by a flat plate like base member and a concave cap member. Moreover, the electrode pattern of the surface acoustic wave element should not be limited to that of the above preferred embodiment.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing a surface acoustic wave apparatus, comprising the steps of:
   bump-bonding a surface acoustic wave element and a base member together through bumps having a melting point of about 450° C. or higher such that the surface acoustic wave element is fixed with a face down configuration to a bottom surface of a recess of the base member; and
   bonding a cap member and the base member with a wax material by heating the cap member and the base member substantially uniformly at a temperature higher than the melting point of the wax material to melt the wax material.

2. The method of manufacturing a surface acoustic wave apparatus according to claim 1, wherein the wax material is selected from the group consisting of a solder, an Au—Sn alloy and a low melting point glass.

3. The method of manufacturing a surface acoustic wave apparatus according to claim 1, wherein a plurality of electrode pads are provided on the surface acoustic wave element and a plurality of electrode lands are provided on the surface of the recess of the base member, and the bumps connect the electrode pads and the electrode lands.

4. The method of manufacturing a surface acoustic wave apparatus according to claim 1, wherein the bumps used during the bump bonding process are made of metal.

5. The method of manufacturing a surface acoustic wave apparatus according to claim 1, wherein the base member and the cap member together define a package, the method further comprising the step of sealing the surface acoustic wave element in an air-tight manner in the package defined by the base member and the cap member.

6. The method of manufacturing a surface acoustic wave apparatus according to claim 1, wherein a gap is defined between the surface acoustic wave element and the base member.

7. The method of manufacturing a surface acoustic wave apparatus according to claim 1, wherein the surface acoustic wave element includes a piezoelectric substrate and interdigital transducer electrodes, reflector electrodes, outlet electrodes extending from the interdigital transducer electrodes, and electrode pads connected with the outlet electrodes.

8. The method of manufacturing a surface acoustic wave apparatus according to claim 7, wherein the piezoelectric substrate is made of one of lithium tantalate and lithium niobate.

9. The method of manufacturing a surface acoustic wave apparatus according to claim 7, wherein the electrode pattern is of one of Al and an alloy containing Al.

10. The method of manufacturing a surface acoustic wave apparatus according to claim 1, wherein the base member has a concave configuration.

11. The method of manufacturing a surface acoustic wave apparatus according to claim 1, wherein the base member is formed by laminating a plurality of ceramic layers.

12. The method of manufacturing a surface acoustic wave apparatus according to claim 1, wherein the cap member includes a metal plate made of one of a Fe—Ni alloy and an alloy containing Fe.

13. The method of manufacturing a surface acoustic wave apparatus according to claim 1, further including the step of simultaneously applying a supersonic wave and heat to the surface acoustic wave element so that the surface acoustic wave element is fixed with a face down configuration to the bottom surface of the recess of the base member.

14. The method of manufacturing a surface acoustic wave apparatus according to claim 13, wherein a plurality of electrode pads are provided on the surface acoustic wave element and a plurality of electrode lands are provided on the surface of the recess of the base member, and each electrode pad is joined to one of the electrode lands via the bump after the application of the supersonic wave and heat.

15. The method of manufacturing a surface acoustic wave apparatus according to claim 1, further including the step of applying one of a supersonic wave and heat to the surface acoustic wave element so that the surface acoustic wave element is fixed with a face down configuration to the bottom surface of the recess of the base member.

16. The method of manufacturing a surface acoustic wave apparatus according to claim 15, wherein a plurality of electrode pads are provided on the surface acoustic wave element and a plurality of electrode lands are provided on the surface of the recess of the base member, and each electrode pad is joined to one of the electrode lands via the bump after the application of the one of a supersonic wave and heat.

17. The method of manufacturing a surface acoustic wave apparatus according to claim 1, wherein the bumps are made of a material including Au.

18. The method of manufacturing a surface acoustic wave apparatus according to claim 1, wherein the bump-bonding process is a ball-bonding process.

19. The method of manufacturing a surface acoustic wave apparatus according to claim 1, further comprising the step of placing the cap member and the base member into a reflow furnace to substantially uniformly heat the base member, the surface acoustic wave element and the cap member to a temperature higher than the melting point of the wax material.

20. The method of manufacturing a surface acoustic wave apparatus according to claim 19, wherein the bumps are not melting during the heating.

21. The method of manufacturing a surface acoustic wave apparatus according to claim 1, wherein said step of heating the cap member and the base member substantially uniformly at a temperature higher than the melting point of the wax material to melt the wax material is performed at a temperature that is lower than the melting point of the bumps.

* * * * *